(12) United States Patent
Liou et al.

(10) Patent No.: US 6,479,372 B1
(45) Date of Patent: Nov. 12, 2002

(54) METHOD FOR AVOIDING WATER MARKS FORMED DURING CLEANING AFTER WELL IMPLANTATION

(75) Inventors: Jimmy Liou, Hsin-Chu; Ching-Fang Chu, Hsin-Chu Hsien, both of (TW)

(73) Assignee: United Microelectronics Corp., Hsin-Chu (TW)

( * ) Notice: Subject to any disclaimer, the term of this patent is extended or adjusted under 35 U.S.C. 154(b) by 59 days.

(21) Appl. No.: 09/690,520

(22) Filed: Oct. 17, 2000

(51) Int. Cl.[7] .............................................. H01L 21/425
(52) U.S. Cl. ........................ 438/524; 438/745; 438/906; 438/725
(58) Field of Search .................................. 438/524, 705, 438/948, 745, 725, 542, 906

(56) References Cited

U.S. PATENT DOCUMENTS

| | | | |
|---|---|---|---|
| 5,803,980 A | * | 9/1998 | Pas et al. ........................ 134/2 |
| 5,895,272 A | * | 4/1999 | Li ................................ 438/705 |
| 6,235,122 B1 | * | 5/2001 | Zhang et al. ................ 438/745 |

* cited by examiner

*Primary Examiner*—Caridad Everhart
(74) *Attorney, Agent, or Firm*—Powell, Goldstein, Frazer & Murphy LLP

(57) ABSTRACT

A method for forming a hydrophilic surface on a silicon substrate during cleaning step after well implantation comprises providing a silicon substrate and an insulating layer is deposited thereon for mask alignment requirement. A photoresist layer is formed on the insulating layer and then a well pattern is transferred into the photoresist layer to expose partial the insulating layer thereunder the well defined. Next, implants are implanted into the photoresist layer, the insulating layer and the silicon substrate. Then the insulating layer exposed by the photoresist layer is removed and in-situ a native oxide is formed on the silicon substrate thereunder the well defined whereby changes the surface of the silicon substrate from hydrophobic into hydrophilic. A hard skin on the photoresist layer, resulting from implantation, is removed by oxygen plasma ashing and then the surface of the insulating layer and the silicon substrate are cleaned by conventional technologies.

16 Claims, 6 Drawing Sheets

METHOD FOR AVOIDING WATER MARKS FORMED DURING CLEANING AFTER WELL IMPLANTATION

BACKGROUND OF THE INVENTION

1. Field of the Invention

The invention relates to a method for avoiding the formation of water marks, and more particularly to a method for avoiding the formation of water marks during drying of cleaning procedure after well implantation.

2. Description of the Prior Art

The formation of water marks is a serious problem during drying of cleaning procedure, particular after spin-drying. There are several drawbacks of water marks. First, they result in the formation of non-uniform oxide thickness and further the happening of non-uniform dopant distribution after following implantation and thermal cycles. Second, they maybe confuse any succeeding in-line inspections and further disturb the process fluency.

As shown on FIG. 1, a conventional manufacture flow, that water marks frequently happen is a procedure of performing well implantation. First, an insulating layer, such as tetra-ethyl-ortho-silicate (TEOS), is deposited on a silicon substrate by using low pressure chemical vapor deposition (step 110). For the mask alignment, the insulating layer is generally thick enough to meet the requirement. A photoresist layer is formed on the insulating layer. Then a pattern defining a well region in the silicon substrate is transferred into the photoresist layer by lithography method (step 111) to expose partial surface of the insulating layer that the well region is defined thereunder. Next, the exposed insulating layer is removed by conventional buffered-oxide etch (BOE) dip (step 112). After removing the exposed insulating layer, a bare zone of the silicon substrate is formed. The corner between sidewalls of the insulating layer and the bare zone is very shaped because of height variation from topside of the photoresist layer and the bare zone of the silicon substrate.

Implants for the well are then implanted into, the photoresist layer, the insulating layer and the silicon substrate (step 113). Next, a hard skin, resulting from well implantation on the photoresist, is first removed by oxygen plasma ashing (step 114). Finally the residue of the photoresist layer is removed by the conventional wet chemical clean technology, such as using Caro's acid (sulfuric acid and hydrogen peroxygen) and RCA-1(APM plus HPM, APM= $NH_4OH+H_2O_2+H_2O$; $HPM=HCL+H_2O_2+H_2O$) (step 115), followed by spin-drying. During the period of spin-drying, a little water drops maybe stop at the corners between the sidewalls of the insulating layer and the bare zone of the silicon substrate because of large height variation. Those water drops definitely result in the formation of water marks.

As depicted in FIG. 2A, a silicon substrate 120 is provided and an insulating layer 121 is deposited thereon. The insulating layer 121 is formed by the method of low pressure chemical vapor deposition and has a thickness about 3000 Angstrom so as to be for mask alignment requirement.

Next, a photoresist layer 130 is first formed on the insulating layer 121. The thickness of the photoresist layer 130 is about 9000 Angstrom. Then a pattern for defining well region in the silicon substrate 120 is transferred into the photoresist layer 130 so as to exposure partial surface of the insulating layer, shown on FIG. 2B. Next, the insulating layer 121 exposed by the photoresist layer 130 is first removed to expose the bare zone 150 of the silicon substrate 120 shown on FIG. 2C. The removal of the exposed insulating layer 121 uses a conventional BOE dip. After removing the exposed insulating layer 121, the height variation between topside of the photoresist layer 130 and the bare zone 150 is about 1.2 um. Implants 140 are implanted into the photoresist layer 130, the insulating layer 121 and the silicon substrate 120. Followings are cleaning procedures. First, a hard skin (not shown), resulting from the implantation on the photoresist polymer 130, is removed by using oxygen plasma ashing. Then residue of the photoresist layer 130 is removed by using conventional method, such as the Caro's acid plus RCA-1 solution. Finally a wafers boat is dried by the conventional method, such as spin-drying. Generally, during spin-drying, water drops, stopping at the corners of the bare zone 150, can't be spin-out because of large height variation. The addition of the hydrophobic bare zone 150, those water drops form water marks about 0.1 mm in diameter at the corners between the insulating layer and the hydrophobic bare zone of the silicon substrate.

However, In-situ removal of the insulating layer and the photoresist layer by combination of BOE dip and the Caro's acid without plasma ashing can avoids the formation of water marks. But it is difficult to remove the hard skin, resulting from well implantation, by the BOE dip and the Caro's acid. Accordingly, the conventional process has some drawbacks for performing well implantation. The main shortcoming is the formation of water marks because of the hydrophobic bare zone of the silicon substrate.

SUMMARY OF THE INVENTION

It is an object of the present invention to provide a method for avoiding water marks formed during cleaning step after well implantation. A native oxide is formed on an exposed silicon substrate to avoid the formation of water marks.

It is another object of the present invention to provide a method for forming the hydrophilic surface of the silicon substrate during cleaning step after well implantation. The hydrophilic surface can avoid the formation of water marks.

In the present invention, a method comprises providing a silicon substrate. An insulating layer is deposited on the silicon substrate and a photoresist layer formed thereon. A well pattern is transferred into the photoresist layer to expose partial the insulating layer thereunder the well defined. Implants are implanted into the photoresist layer, the insulating layer and the silicon substrate. Then the insulating layer exposed by the photoresist layer is removed and in-situ a native oxide is formed on the silicon substrate thereunder the well defined, whereby avoids water marks formed at the corner of the insulating layer and the silicon substrate. In-situ removal of the insulating layer and formation of the native oxide are by using BOE dip plus Caro's acid dip so that the native oxide can change the surface of the silicon substrate from hydrophobic into hydrophilic to avoid the formation of water marks.

BRIEF DESCRIPTION OF THE DRAWINGS

A better understanding of the invention may be derived by reading the following detailed description with reference to the accompanying drawing wherein.

DESCRIPTION OF THE PREFERRED EMBODIMENT

The semiconductor devices of the present invention are applicable to a board range of semiconductor devices and can be fabricated from a variety of semiconductor materials. While the invention is described in terms of a single preferred embodiment, those skilled in the art will recognize that many steps described below can be altered and that species and types of substrate and dopant as well as other materials substitutions can be freely made without departing from the spirit and scope of the invention.

Furthermore, there is shown a representative portion of a semiconductor structure of the present invention in enlarged, cross-sections of the two dimensional views at several stages of fabrication. The drawings are not necessarily to scale, as the thickness of the various layers are shown for clarify of illustration and should not be interpreted in a limiting sense. Accordingly, these regions will have dimensions, including length, width and depth, when fabricated in an actual device.

In the present invention, a method comprises providing a silicon substrate and an insulating layer is deposited thereon for mask alignment requirement. A photoresist layer is formed on the insulating layer and then a well pattern is transferred into the photoresist layer to expose partial the insulating layer thereunder the well defined. Next, implants are implanted into the photoresist layer, the insulating layer and the silicon substrate. Then the insulating layer exposed by the photoresist layer is removed and in-situ a native oxide is formed on the silicon substrate thereunder the well defined whereby avoids water marks at the corner of the insulating layer and the silicon substrate. A hard skin on the photoresist layer, resulting from implantation, is removed by oxygen plasma ashing and then the surface of the insulating layer and the silicon substrate are cleaned by conventional technologies.

Figure 1:
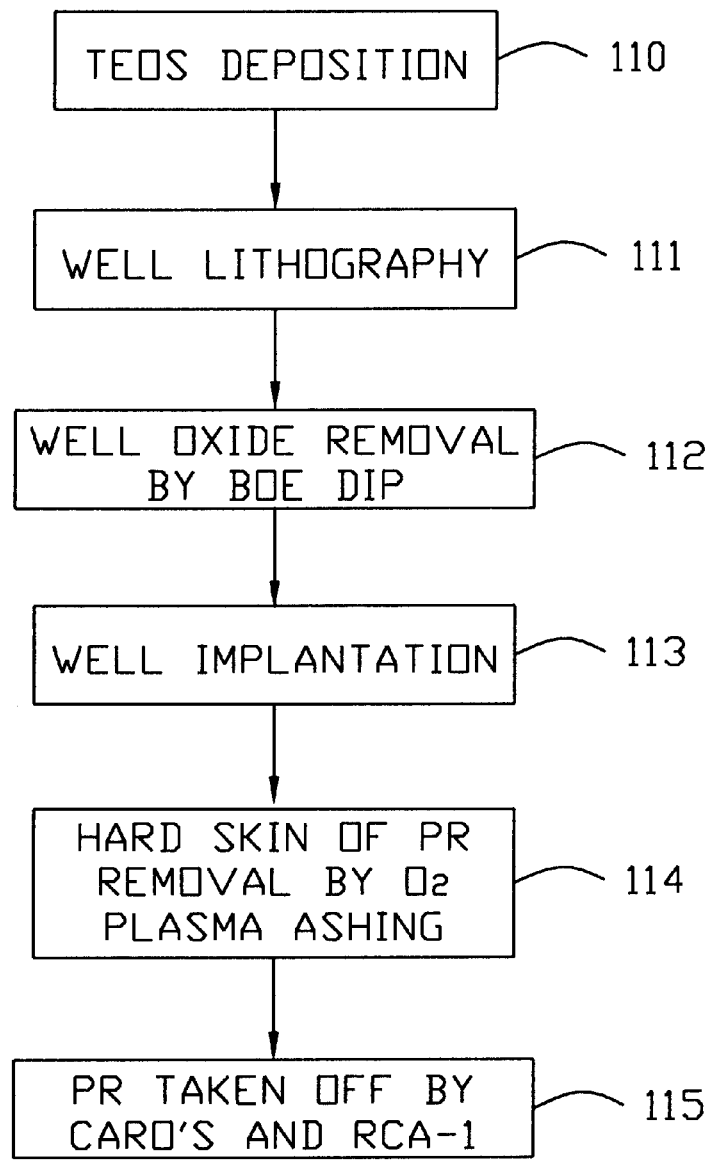
FIG. 1 is a flow chart illustrating a method for performing a well implantation by the conventional procedure.
Figure 2A:
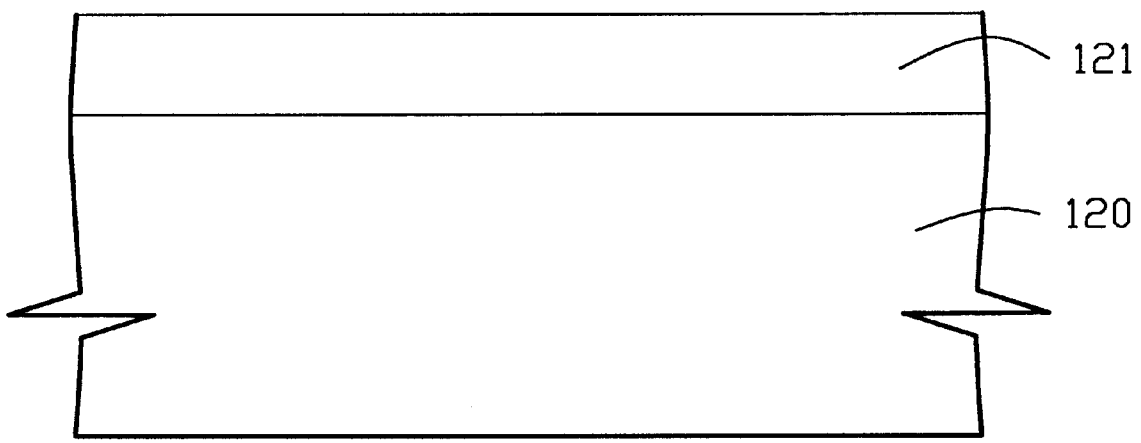
FIGS. 2A–2C are a series of cross-sectional drawings illustrating a method for performing well implantation by the conventional procedure.
Figure 2B:
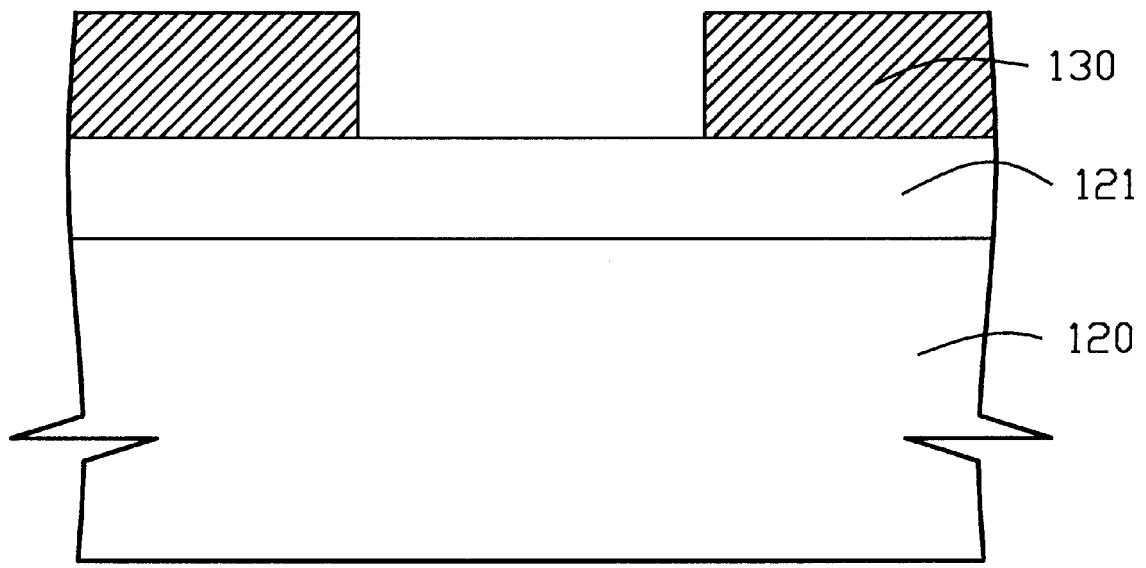
Figure 2C:
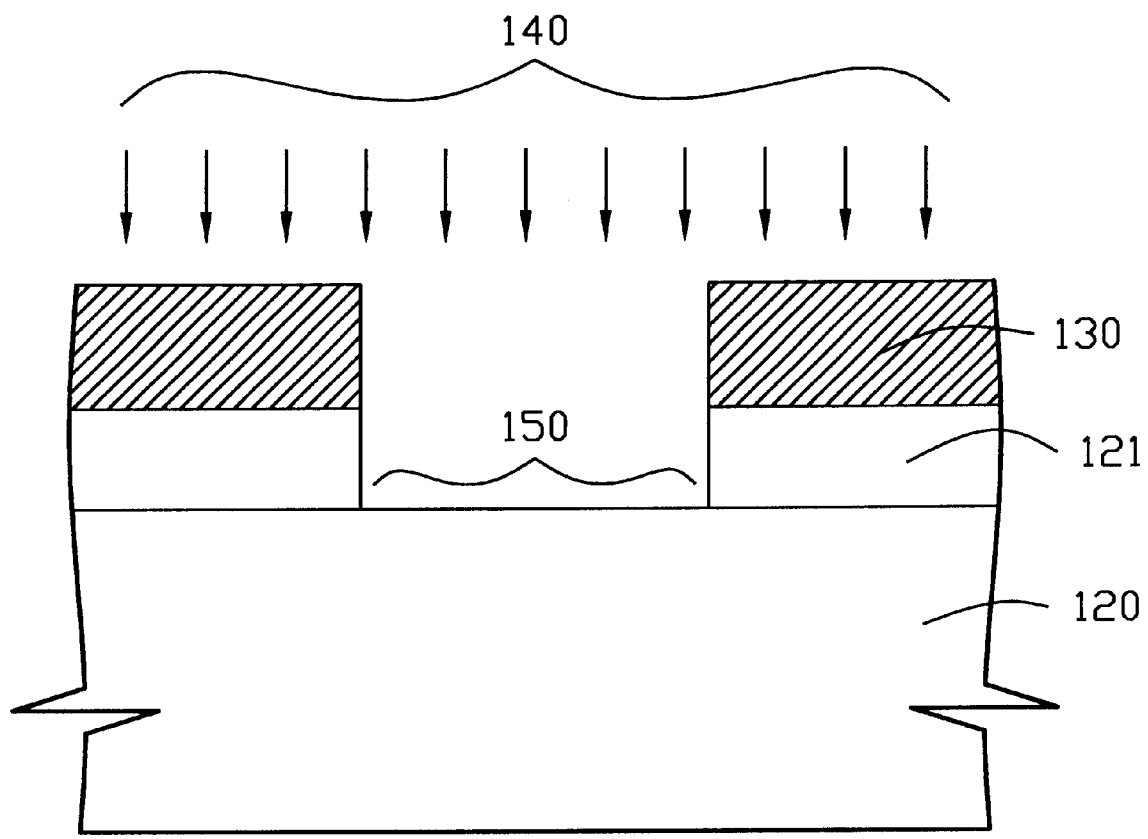
Figure 3:
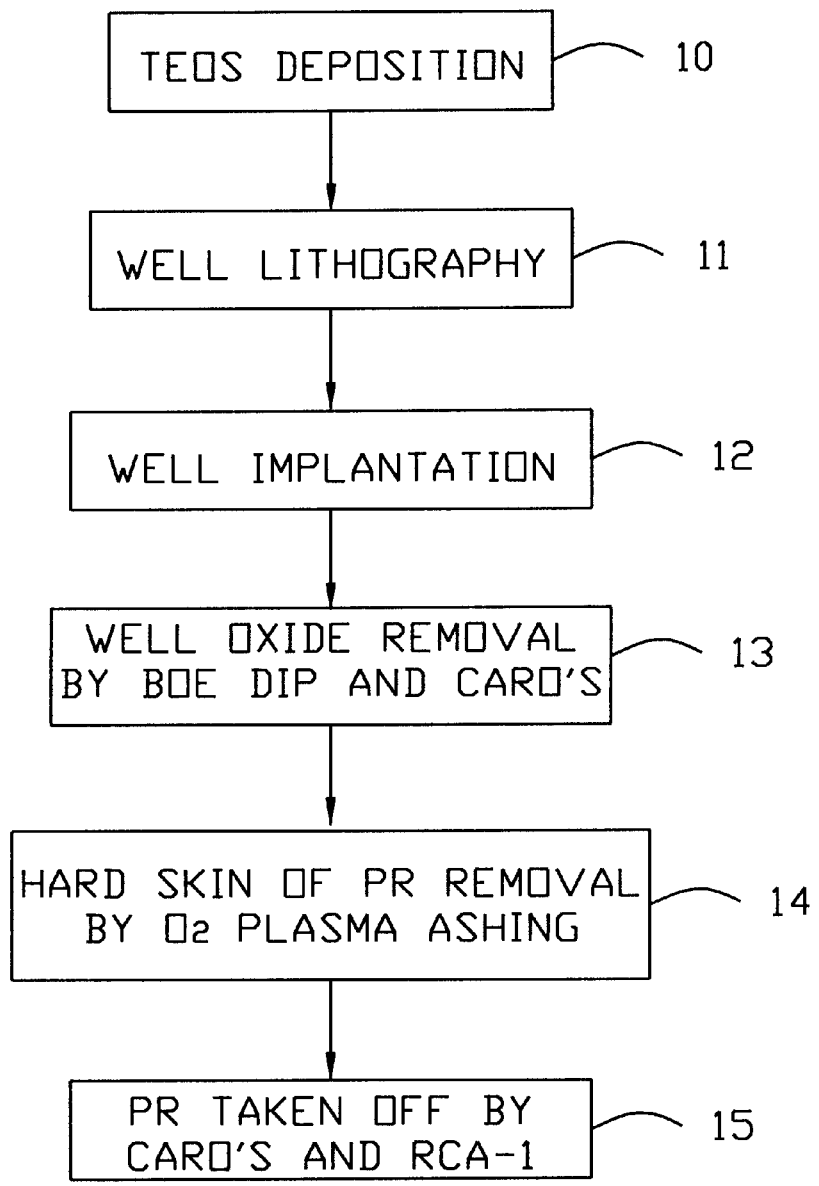
FIG. 3 is a flow chart illustrating a method for performing well implantation by the present invention.

A manufacture flow is shown on FIG. 3. First, an insulating layer, such as tetra-ethyl-ortho-silicate (TEOS), is deposited on a silicon substrate by using low pressure chemical vapor deposition (step 10). A photoresist layer is formed on the insulating layer. Then a pattern defining a well region in the silicon substrate is transferred into the photoresist layer by lithography method (step 11) to expose partial surface of the insulating layer that the well region is defined thereunder. Next steps are the key steps of the present invention. Implants for the well are first implanted into the photoresist layer, the insulating layer and the silicon substrate (step 12) instead of removal of the exposed insulating layer in conventional process. The exposed insulating layer is removed by conventional buffered-oxide etch (BOE) dip plus thereafter dipping in a solution of sulfuric acid and hydrogen peroxide (Caro's acid) (step 13). Then a hard skin resulting from well implantation on the photoresist is removed by oxygen plasma ashing (step 14). Finally the residue of the photoresist layer is removed by the conventional wet chemical clean technology, such as using Caro's acid and RCA-1 (step 15).

Figure 4A:
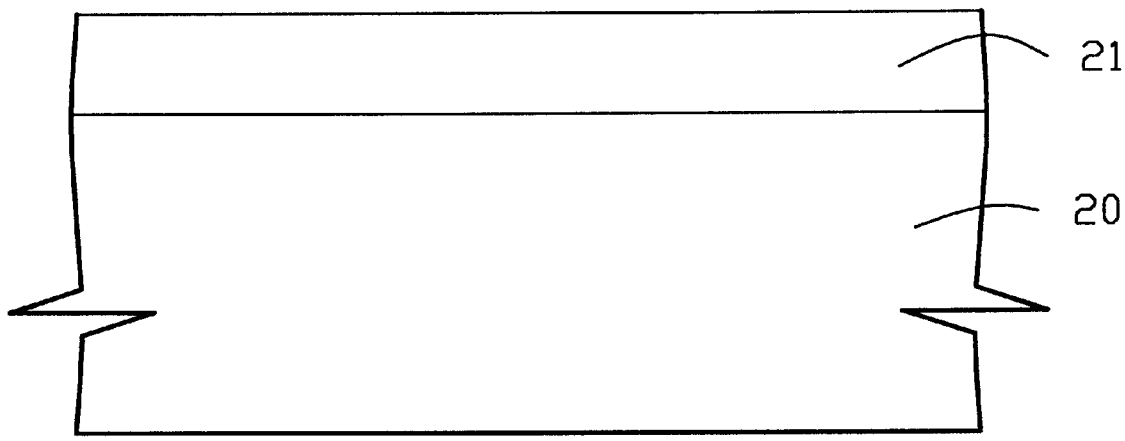
FIGS. 4A–4D are a series of cross-sectional drawings illustrating a method for performing well implantation in accordance with the present invention.

In the embodiment of the present invention, as depicted in FIG. 4A, a substrate 20 is provided and an insulating layer 21 is deposited thereon. The insulating layer 21 is formed by the method of low pressure chemical vapor deposition and has a thickness about 3000 Angstrom so as to be for mask alignment requirement.

Figure 4B:
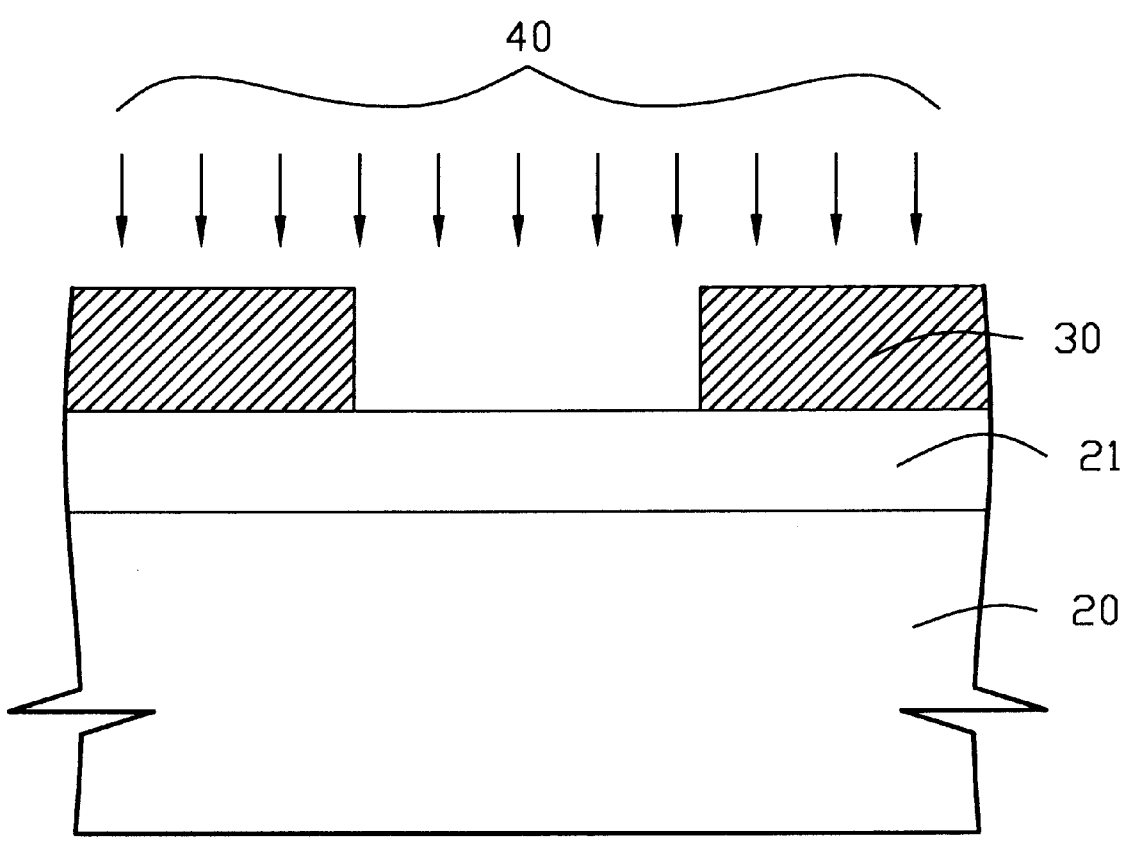

Next, a photoresist layer 30 is first formed on the insulating layer 21. The thickness of the photoresist layer 30 is about 9000 Angstrom. Then a pattern for defining well region in the silicon substrate 20 is transferred into the photoresist layer 30 so as to exposure partial surface of the insulating layer. As a key step of the present invention shown on FIG. 4B, implants 40 are implanted into the photoresist layer 30, the insulating layer 21 and the silicon substrate 20 prior to removing the exposed insulating layer thereunder the well defined. Of course, in the embodiment, the implantation energy may be raised for penetrating the insulating layer 21 to meet requirement of dopant distribution profile in the silicon substrate 20.

Figure 4C:
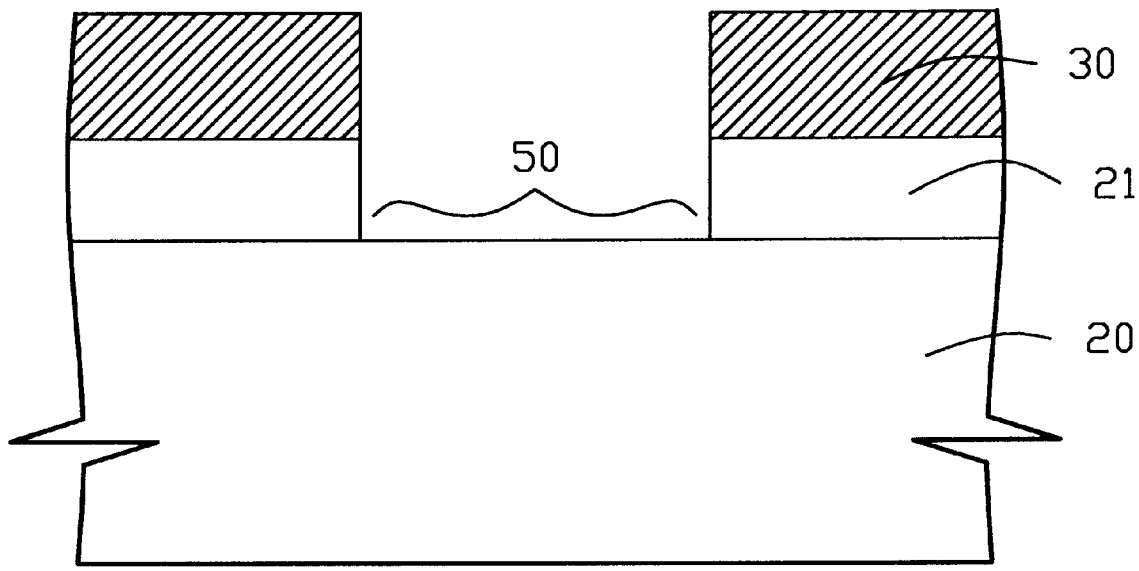

As another key step of the present invention, the insulating layer 21 exposed by the photoresist layer 30 is first removed. The removal of the exposed insulating layer 21 uses a modified dip procedure including conventional BOE dip and the Caro's acid dip. The purpose of BOE dip is to remove the exposed insulating layer 21. The surface of the silicon substrate 20 has bare hydrophobic zone 50 as soon as treated with BOE dip, shown as FIG. 4C. Then the whole boat is subsequently dipped into the Caro's acid at time about 30 to 60 seconds and a native oxide layer (not shown) is in-situ formed on the bare hydrophobic zone 50. The native oxide layer can change the bare zone 50 from hydrophobic to hydrophilic that can avoid formation of water marks. In particular, the time in the Caro's acid dip controlled more than 30 seconds is under consideration for stability of tools movement, such as robots. While the time in the Caro's acid dip controlled less than 60 seconds is under consideration for pollution of the peeling photoresist layer that is attacked by the Caro's acid. Furthermore, the dip step in the Caro's acid executes at a temperature about 80° C. similar to an operating temperature in general.

Figure 4D:
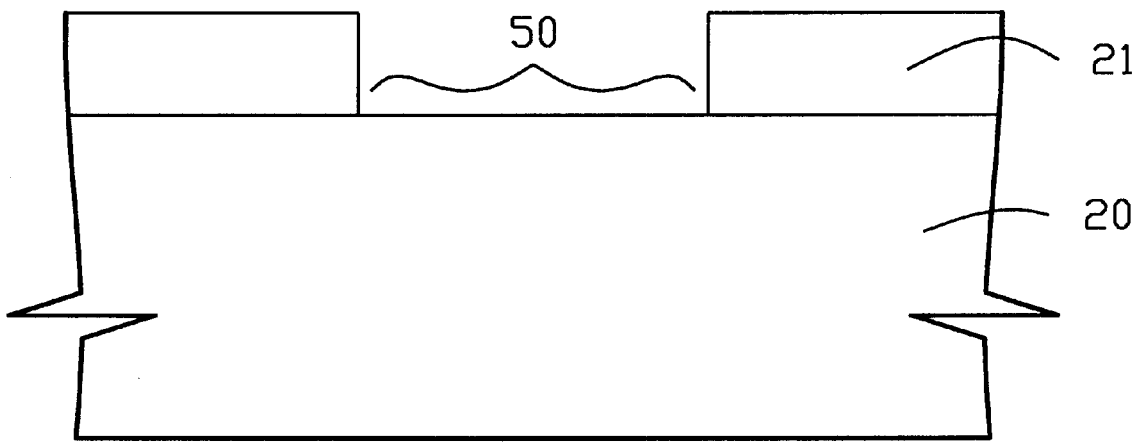

The following step is depicted as FIG. 4D, a hard skin (not shown), resulting from the implantation on the photoresist polymer 30, is removed by using oxygen plasma ashing. Then residue of the photoresist layer 30 is removed by using conventional method, such as the Caro's acid plus RCA-1 solution. Finally the boat is dried by the conventional method, such as spin-drying.

It is an object of the present invention to provide a method for avoiding the formation of water marks during drying of clean procedure after well implantation. The step of dip in the Caro's acid is added in the removal of the insulating layer so as to form a hydrophilic native oxide on the surface of the silicon substrate. The hydrophilic surface, compared with a hydrophobic one by the conventional cleaning procedure, can avoid the formation of water marks at the corners between the insulating layer and the silicon substrate.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for avoiding water marks formed during cleaning step of well implantation, said method comprising:
providing a silicon substrate;
depositing an insulating layer on said silicon substrate;

forming a photoresist layer on said insulating layer;

transferring a well pattern into said photoresist layer to expose partial said insulating layer thereunder said well defined;

implanting implants into said photoresist layer, said insulating layer and said silicon substrate; and removing said insulating layer exposed by said photoresist layer and in-situ forming a native oxide on said silicon substrate thereunder said well defined whereby formation of water marks at the corner of said insulating layer and said silicon substrate is avoided.

2. The method according to claim 1, wherein said insulating layer comprises tetra-ethyl-ortho-silicate (TEOS) oxide layer for mask alignment requirement.

3. The method according to claim 1, wherein said implanting step comprises forming a hard skin on said photoresist layer.

4. The method according to claim 1, wherein said removing step is to remove said insulating layer with buffered-oxide etch (BOE) dip followed by dipping in a solution of sulfuric acid and hydrogen peroxide (Caro's acid).

5. The method according to claim 4, wherein dipping in said solution of sulfuric acid and hydrogen peroxide is operated at time about between 30 and 60 seconds.

6. The method according to claim 1, wherein said native oxide is for changing said surface of substrate from hydrophobic to hydrophilic.

7. The method according to claim 1 further comprising:

removing said photoresist layer by oxygen plasma ashing; and cleaning by wet chemical clean technology.

8. A method for avoiding water marks formed during cleaning step of well implantation, said method comprising:

providing a silicon substrate;

depositing an insulating layer on said silicon substrate, said insulating layer for mask alignment requirement;

forming a photoresist layer on said insulating layer;

transferring a well pattern into said photoresist layer to expose partial said insulating layer thereunder said well defined;

implanting implants into said photoresist layer, said insulating layer and said silicon substrate;

removing said insulating layer exposed by said photoresist layer and in-situ forming a native oxide on said silicon substrate thereunder said well defined whereby formation of water marks at the corner of said insulating layer and said silicon substrate is avoided;

removing a hard skin on said photoresist layer by oxygen plasma ashing; and cleaning surface of said insulating layer and said silicon substrate.

9. The method according to claim 8, wherein said insulating layer comprises tetra-ethyl-ortho-silicate (TEOS) oxide layer formed by low pressure chemical vapor deposition.

10. The method according to claim 8, wherein said removing step is to remove said insulating layer with buffered-oxide etch (BOE) dip followed by dipping in a solution of sulfuric acid and hydrogen peroxide (Caro's acid).

11. The method according to claim 10, wherein dipping in said solution of sulfuric acid and hydrogen peroxide is operated in a period between 30 and 60 seconds.

12. The method according to claim 8, wherein said native oxide is for changing said surface of silicon substrate from hydrophobic to hydrophilic.

13. A method for forming a hydrophilic surface on a silicon substrate during cleaning step of well implantation, said method comprising:

depositing an insulating layer on said silicon substrate, said insulating layer for mask alignment requirement;

forming a photoresist layer on said insulating layer;

transferring a well pattern into said photoresist layer to expose partial said insulating layer thereunder said well defined;

implanting implants into said photoresist layer, said insulating layer and said silicon substrate;

removing said insulating layer exposed by said photoresist layer and in-situ forming a native oxide on exposed said silicon substrate thereunder said well defined whereby change exposed said surface from hydrophobic to hydrophilic;

removing a hard skin on said photoresist layer by oxygen plasma ashing; and cleaning surface of said insulating layer and said silicon substrate.

14. The method according to claim 13, wherein said insulating layer comprises tetra-ethyl-ortho-silicate (TEOS) oxide layer formed by low pressure chemical vapor deposition.

15. The method according to claim 13, wherein said removing step is to remove said insulating layer with buffered-oxide etch (BOE) dip followed by dipping in a solution of sulfuric acid and hydrogen peroxide (Caro's acid).

16. The method according to claim 15, wherein dipping in said solution of sulfuric acid and hydrogen peroxide is operated in a period between 30 and 60 seconds.

* * * * *